United States Patent
Chen et al.

(10) Patent No.: US 10,724,926 B2
(45) Date of Patent: Jul. 28, 2020

(54) POWER TOOL SYSTEM

(71) Applicant: CHERVON (HK) LIMITED, Wanchai (HK)

(72) Inventors: Wu Chen, Nanjing (CN); Guigong Ni, Nanjing (CN); Tianshi Yuan, Nanjing (CN); Toshinari Yamaoka, Nanjing (CN)

(73) Assignee: CHERVON (HK) LIMITED, Wanchai (HK)

( * ) Notice: Subject to any disclaimer, the term of this patent is extended or adjusted under 35 U.S.C. 154(b) by 138 days.

(21) Appl. No.: 15/464,583

(22) Filed: Mar. 21, 2017

(65) Prior Publication Data

US 2017/0276572 A1    Sep. 28, 2017

(30) Foreign Application Priority Data

Mar. 23, 2016  (CN) .......................... 2016 1 0170491
Mar. 29, 2016  (CN) .......................... 2016 1 0188606

(51) Int. Cl.
| | |
|---|---|
| B25F 5/00 | (2006.01) |
| G01M 99/00 | (2011.01) |
| G01R 31/3835 | (2019.01) |
| G06Q 10/00 | (2012.01) |
| A01D 34/67 | (2006.01) |
| A01D 69/02 | (2006.01) |
| G01R 31/34 | (2020.01) |
| A01D 101/00 | (2006.01) |

(Continued)

(52) U.S. Cl.
CPC ............ *G01M 99/005* (2013.01); *A01D 34/67* (2013.01); *A01D 69/02* (2013.01); *B25F 5/00* (2013.01); *G01R 31/343* (2013.01); *G01R 31/3835* (2019.01); *G06Q 10/00* (2013.01); *A01D 2101/00* (2013.01); *A01G 3/053* (2013.01); *H04W 84/18* (2013.01)

(58) Field of Classification Search
CPC .... G01M 99/005; B25F 5/00; A01D 2101/00; A01G 3/053
See application file for complete search history.

(56) References Cited

U.S. PATENT DOCUMENTS

2015/0128547 A1*  5/2015  Einecke ............... A01D 34/008
                                                 56/10.2 A

FOREIGN PATENT DOCUMENTS

| CN | 103217976 A | 7/2013 |
|---|---|---|
| CN | 103576567 A | 2/2014 |

(Continued)

OTHER PUBLICATIONS

Liu et al., Design and Realization of Visual Wireless Autonomous Lawn Mower Based on Machine Vision, 2014 IEEE, pp. 353-358 (Year: 2014).*

*Primary Examiner* — Toan M Le
(74) *Attorney, Agent, or Firm* — Greenberg Traurig, LLP

(57) ABSTRACT

A power tool system has a power tool including an electrical device, a power device for powering the electrical device, a position or target detection system for detecting a position of the power tool and/or the power device, a source-based transceiver for at least transmitting data corresponding to the position detected by the position detection system, and a data retrieval and/or process equipment for selectively receiving data from the source-based transceiver at a position around the power tool and/or a position remotely removed away from the power tool.

7 Claims, 16 Drawing Sheets

(51) Int. Cl.
    *A01G 3/053*      (2006.01)
    *H04W 84/18*      (2009.01)

(56) References Cited

FOREIGN PATENT DOCUMENTS

| CN | 204992664 U | 1/2016 |
| CN | 105322600 A | 2/2016 |

* cited by examiner

POWER TOOL SYSTEM

This application claims the benefit of CN 201610170491.3, filed on Mar. 23, 2016, and CN 201610188606.1, filed on Mar. 29, 2016, the disclosures of which are incorporated herein by reference in their entirety.

FIELD OF THE DISCLOSURE

The present disclosure relates generally to power tools, and more particularly to a system for power tools.

BACKGROUND OF THE DISCLOSURE

With the development of networks and applications for mobile devices popular in our daily life, a number of objects are linked by a communication link or network to share information there between. This will be changing peoples' life environment.

In the field of power tools, power tools can be used more efficiently if the internal performance information of a power tool is obtained by an external mobile equipment or another power tool linked to the power tool. The performance information of the power tool will also help the user to enable a personal control suitable for the respective power tool, and to diagnose problems with the power tools or to perform preventative maintenance before problems arise. The above-described is important for the power tool to be later developed and improved.

The statements in this section merely provide background information related to the present disclosure and may not constitute prior art.

SUMMARY

In one aspect of the disclosure, a power tool system comprises a power tool including an electrical device, a power device for powering the electrical device, a fault detection subsystem for detecting failure of at least one of the electrical device, the power device, and a connection circuit connected between the electrical device and the power device, a source-based transceiver for at least transmitting data corresponding to the failure detected by the detection subsystem, and a data retrieval and/or process equipment adapted for receipt of data from the source-based transceiver, the data retrieval and/or process equipment being independent of the power tool and configured to be remotely removed away from the power tool.

In another aspect of the disclosure, a power tool system comprises a power tool including an electrical device, a power device for powering the electrical device, a position detection system for detecting a position of the power tool and/or the power device, a source-based transceiver for at least transmitting data corresponding to the position detected by the position detection system, and a data retrieval and/or process equipment adapted to selectively receive data from the source-based transceiver at a position around the power tool and/or a position remotely removed away from the power tool.

In another aspect of the disclosure, a power tool system comprises a power tool including an electrical device, a power device for powering the electrical device, a target detection subsystem for detecting a target data of the power tool and/or the power device, a source-based transceiver for at least transmitting data corresponding to the position detected by the target detection system, and a data retrieval and/or process equipment adapted to selectively receive data from the source-based transceiver at a position around the power tool and/or a position remotely removed away from the power tool, wherein the power tool system includes a main power supply circuit for powering any part of the power tool system including the target detection subsystem and the auxiliary power supply circuit is utilized to power the target detection subsystem when the main power supply circuit is disenabled.

Further areas of applicability will become apparent from the description provided herein. It should be understood that the description and specific examples are intended for purposes of illustration only and are not intended to limit the scope of the present disclosure.

Figure 1:
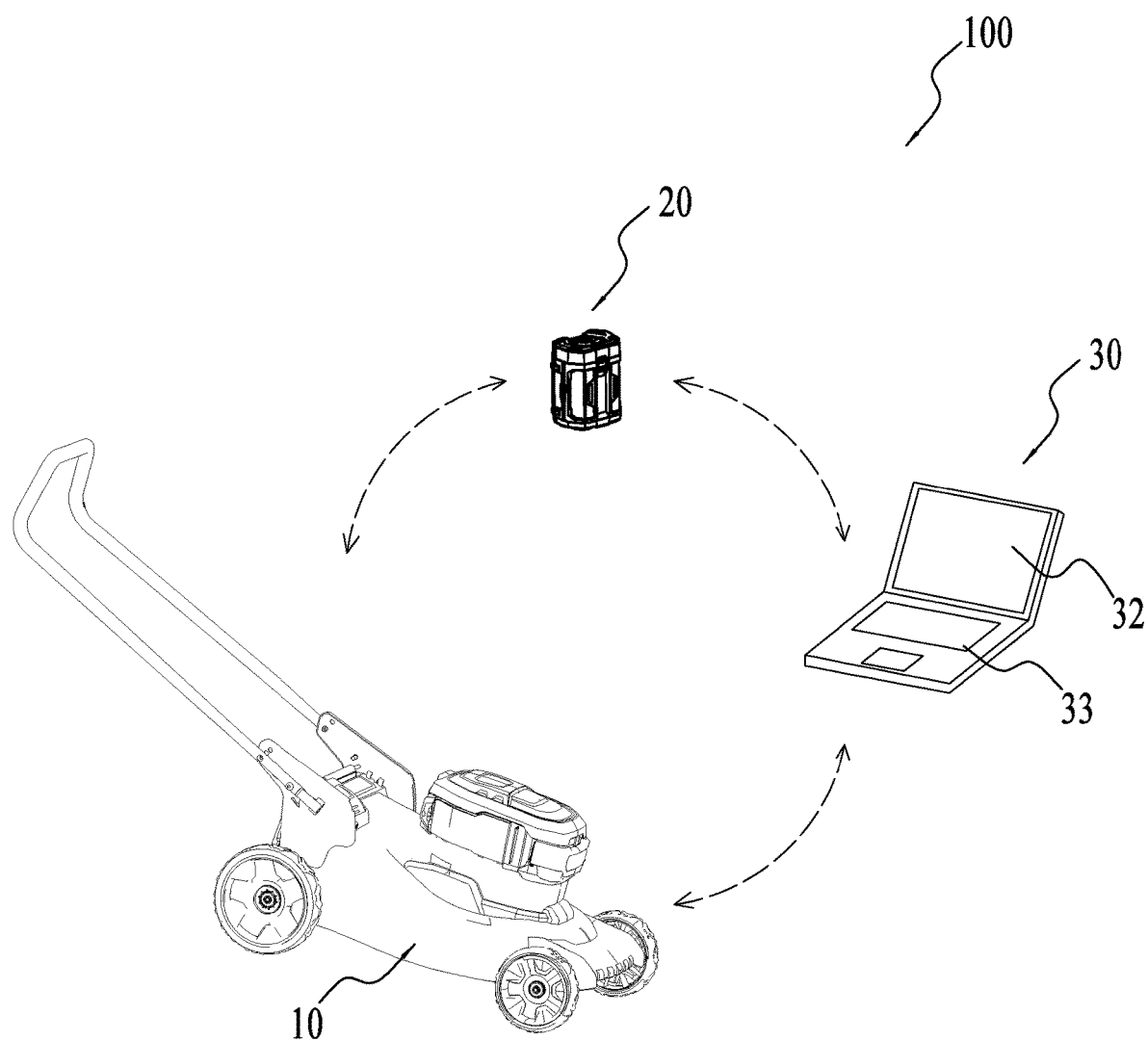
FIG. 1 illustrates an exemplary power tool system.

The drawings described herein are for illustrative purposes only of exemplary embodiments and not all possible implementations, and are not intended to limit the scope of the present disclosure. Corresponding reference numerals indicate corresponding parts throughout the several views of the drawings.

DETAILED DESCRIPTION

The following description of the preferred embodiments is merely exemplary in nature and is in no way intended to limit the scope of the invention hereinafter claimed, its application, or uses.

FIG. 1 shows a preferred power tool system 100 including a power tool such as a grass cutter 10, a power device 20 and a data retrieval and/or process equipment 30.

The grass cutter 10 includes a motor for driving the grass blades of the grass cutter 10 to rotate. The power device 20 is for powering the grass cutter 10 and is configured to be connected or mounted onto the grass cutter 10 with an electrical connection to the power device 20.

In one aspect of the disclosure, the power tool system 100 of FIG. 1 includes a fault detection subsystem for detecting failure of any parts and/or any internal units of a power tool and/or the power device.

Figure 2:
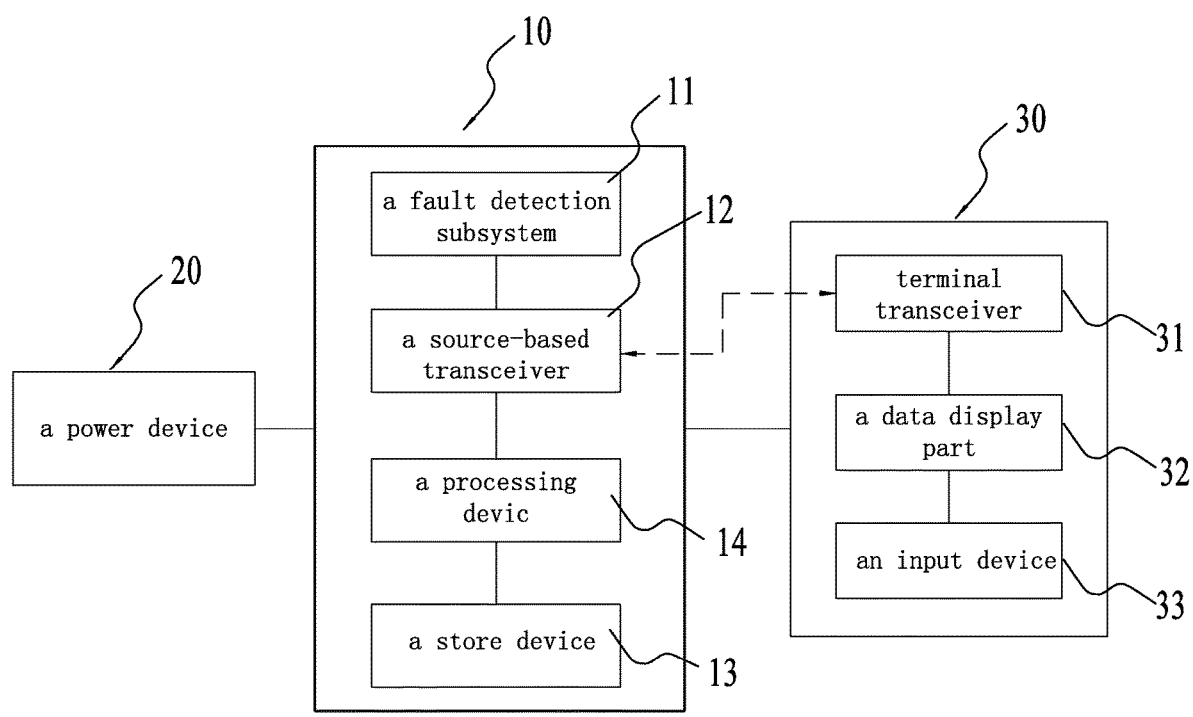
FIG. 2 is a block diagram of the power tool system of FIG. 1 with dashed arrows showing wireless communications between parts.

As shown in FIG. 2, the grass cutter 10 further includes the fault detection subsystem 11, a source-based transceiver 12, a memory/store device 13 and a processing device 14.

The fault detection subsystem is for detecting failure of at least one of the electrical device, the power device, and a connection circuit connected between the electrical device and the power device.

The source-based transceiver 12 is for transmitting data corresponding to any failure detected by the fault detection subsystem.

The store device 13 is for storing predetermined data corresponding to performance parameters of the power tool, the power device and/or the connection circuit worked at a normal state. The predetermined stored data include positions, position variables and/or position accelerations associated with the grass cutter as detected.

The processing device 14 is for comparing detected data as detected by the detection subsystem with the predetermined data stored in the store device 13 to determine whether the power tool, the power device or the connection circuit has had a failure. When any failure of the power tool, the power device and/or the connection circuit is determined by the processing device, the source-based transceiver is controlled to transmit a reminder about the failure information.

In FIG. 1 and FIG. 2, the portable computer can function as a data retrieval and/or process equipment 30. The data retrieval and/or process equipment 30 includes a terminal transceiver 31 and a data display part 32. The terminal transceiver 31 is configured to be remotely removed away from the grass cutter 10 for receipt of data from the source-based transceiver, and the data display part 32 is adapted to display the received data by the terminal transceiver 31. Specifically, the terminal transceiver 31 is configured to be in communication with the source-based transceiver via any one of a local area network, an Internet and a near field communication network or a combination thereof.

In an embodiment, the data retrieval and/or process equipment 30 at least includes an input device 33 for the user to operate the input device so as to control the grass cutter 10 or the power device 20 based on the failure information displayed on the data display part 32. For example, when the failure information of the grass cutter 10 is displayed on the data display part 32 to the user, the user can perform the operation, such as to enable or disenable the grass cutter 10. The data retrieval and/or process equipment 30 transmits the instruction from the input device by the user to the grass cutter 10 via a wireless communication in order to disenable the grass cutter 10. In an alternative embodiment, the data display part 32 and the input device 33 are integrated into a touchable display screen having both of a display and a touch input function.

As such, the user can monitor and control the grass cutter 10 at a remote distance by the external data retrieval and/or process equipment 30.

In an embodiment, the grass cutter 10 includes a drive system driven by a motor to drive the cutter blades of the grass cutter to rotate with respect to a rotate axis.

The power tool system includes a fault detection subsystem 11 comprising a position sensor for detecting positions of the drive system or the blades of the grass cutter 10 by sensing rotation speeds, rotation directions, rotation angles of the drive system or the blades of the grass cutter 10, and/or duration time the rotate of the drive system or the blades of the grass cutter 10 maintains. By using the detected data as detected by the fault detection subsystem, the processing device 14 is to compare the detected data with the predetermined data stored in the store device 13, for example the speed of the drive system as detected by the position sensor is lower than a normal value, to determine whether the power tool, the power device or the connection circuit has a failure happened such that a failure reminder is controlled to be transmitted to the data retrieval and/or process equipment.

The fault detection subsystem still includes any other sensor such as a vibration sensor or a noise sensor for detecting the work head or the drive system. When the vibration or noise of the drive system as detected has a value greater than a normal value, the fault detection subsystem 12 can determine the grass cutter 10 has a failure or fault happened. Of course, it is possible to determine the failure or fault based on a combination of various data, such as using a motor current at a normal state and a rotation speed of a cutter blade less than a normal value to determine the failure or fault of the drive system.

As the cutter blade acts as the working unit of the grass cutter 10, a position detection of the cutter blade can be used to determine whether the grass cutter 10 has failed or whether it has been used abnormally.

Figure 3:
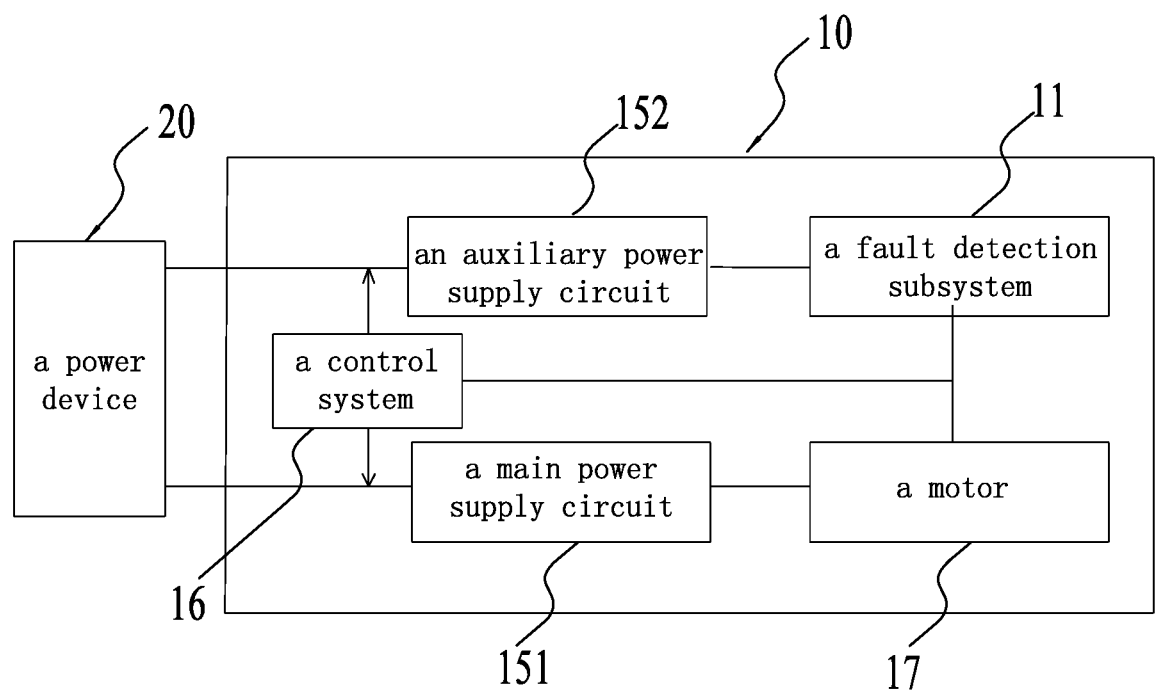
FIG. 3 is a block diagram of a power device and a power tool of the power tool system of FIG. 1 with solid lines showing control relationship of a control system for the power device and the power tool.

In an embodiment of FIG. 3, the grass cutter 10 comprises a main power supply circuit 151 for powering the electrical device, and an auxiliary power supply circuit 152 for powering the fault detection subsystem and a control system 16, wherein the main power supply circuit 151 and the auxiliary power supply circuit 152 both connect to the power device. Specifically, the main power supply circuit 151 is connectable between the power device and the electrical device or the motor 17 while the auxiliary power supply circuit 152 is connected between the power device 20 and the fault detection subsystem 11. When the main power supply circuit is disenabled, the fault detection subsystem 12 still works by the power of the auxiliary power supply circuit 152. In an alternative embodiment, the battery pack may include a main power supply circuit, and an auxiliary power supply circuit which is used for powering at least the fault detection subsystem when the main power supply circuit is disenabled. That is, the power tool system includes a main power supply circuit for powering any part of the power tool system including the fault or target detection subsystem, the auxiliary power supply circuit is utilized to power the target detection subsystem when the main power supply circuit is disenabled. It should be noted that the auxiliary power supply circuit may be within the power tool, the battery pack or any part of the power tool system, or the auxiliary power supply circuit may be an independent device or means external to the power tool and/or the battery pack.

Figure 4:
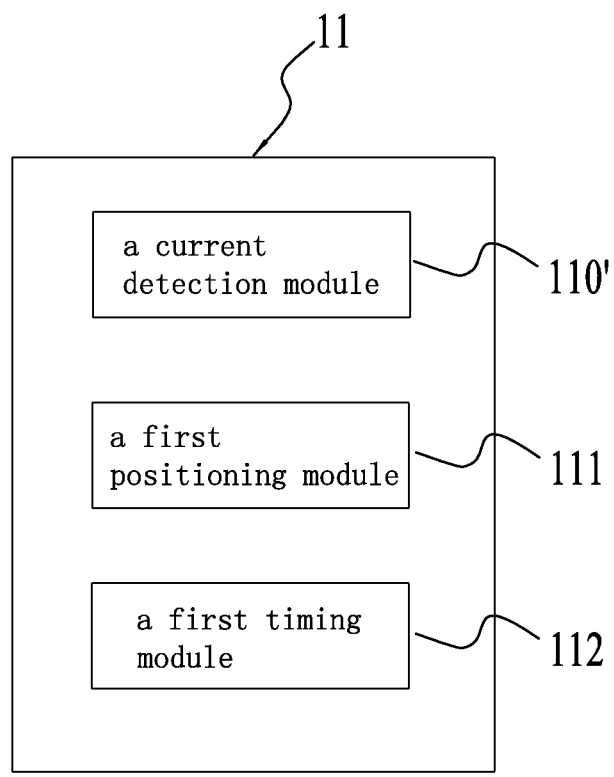
FIG. 4 is a block diagram of a fault detection subsystem of the power tool system of FIG. 1.

In FIG. 4, the fault detection subsystem 11 includes a current detection module 110 for detecting currents, current variables of the motor or the main power supply circuit 151, and/or duration time the current of the motor or the main power supply circuit 151 maintains. By using the detected data as detected by the fault detection subsystem, the processing device 14 is to compare the detected data with the predetermined data stored in the store device 13 to determine when a failure happens. For example, the current detection module 110 is set for detecting the current of the main power supply circuit 151, and the processor 14 determines the main power supply circuit 151 has the failure by judging the current of the main power supply circuit 151 greater than a normal predetermined value stored in the store device 13, and then transmits a failure reminder to the data retrieval and/or process equipment via the source-based transceiver 12.

Figure 5:
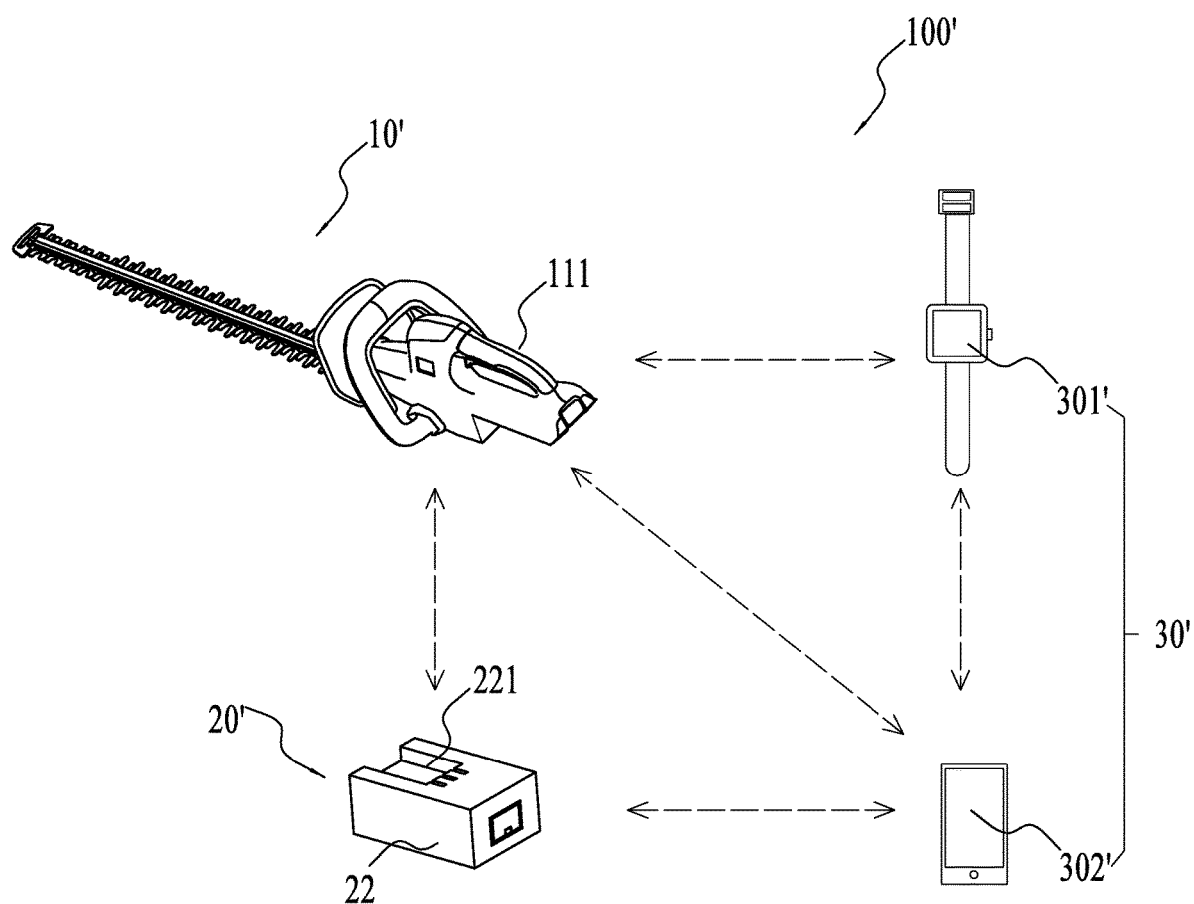
FIG. 5 illustrates another exemplary power tool system.

In FIG. 5, the hardware device of the system 100' mainly includes a hedge trimmer 10', a battery pack 20', and a data retrieval and/or process equipment 30' including a mobile terminal 301' and a wear device 302'.

The hedge trimmer 10' includes a motor, a battery pack, a drive system, a work head, a fault detection subsystem, a control system, a source-based transceiver, a store device, a processing device, a mobile terminal 301' and a wear device 302' each having a source-based transceiver and a data display part. With the above configuration, the fault detection system of the hedge trimmer 10' can also do the fault detection function as described above.

The battery pack 20' includes a battery and a battery case for receiving the battery therein. The battery case includes an attachable interface 221 for the battery pack to be attached onto the hedge trimmer 10'. The fault detection subsystem can be used to detect a voltage, a current, a temperature of the battery pack 20'.

In an embodiment, the fault detection subsystem includes a voltage detection module for detecting a voltage of the battery. Specifically, the voltage detection module is to detect the voltage of the battery pack, the processing device is to compare with the detected voltage of the battery pack, and then the source-based transceiver transmits to the data retrieval and/or process equipment 20' a reminder for informing the user of the failure of the battery pack when the detected voltage of the battery pack by the voltage detection module is too high or too low. The voltage detection module is preferably a voltage sensor.

The fault detection subsystem includes a temperature detection module and/or a current detection module for detecting the temperature and/or the current of the battery pack. When the temperature of the battery pack as detected is too high or too low, the source-based transceiver sends a reminder about the failure of the battery pack to the mobile terminal. Of course, it is possible to determine the failure or fault of the battery pack based on a combination of various data, such as by using the current of the battery pack and the temperature of the battery pack for the reminder to the user.

The battery pack 20' is for powering the hedge trimmer 10'. When the power of the battery pack is gradually consumed, the voltage detection module detects the voltage of the battery pack, and the processing device reads a first control voltage stored in the store device. For example, when the detected voltage is less than the first control voltage, a mobile terminal 301' and/or a wear device 302' is enabled to present a reminder such as the power of the battery pack is not enough while the battery pack still powers the motor and the fault detection subsystem. Further, if the detected voltage of the battery pack is lower than a second control voltage in the store device, the control system sends a stop signal to stop the battery pack powering the fault detection subsystem. Thus, hierarchical control of the power of the battery pack is employed for safety and/or use consideration.

Additionally, the battery pack 20' may include a number of battery cells which are often unbalanced to result in the damage of the battery pack and the unsafe risk. Here, the unbalanced refers to the respective battery cells having different parameters of voltages, temperatures and etc.

In an embodiment, the voltage detection module is to detect a battery cell or a group of battery cells. When the unbalance happens within the group or groups of battery cells, the data display part is controlled to present the reminder for the user by its display screen.

In an alternative embodiment, the hedge trimmer 10' has a fault detection subsystem including a position sensor for detecting position variables of the hedge trimmer 10' so as to determine whether the hedge trimmer 10' has had a failure. The position sensor can be a combination of gyroscopes and positioning devices for different directions of position detection.

Specifically, the parameters determining the failure or fault of the hedge trimmer 10' include positions, position variables and/or position accelerations associated with the hedge trimmer 10'. When a huge impact of the hedge trimmer 10' is detected by the fault detection subsystem in the case of the hedge trimmer 10' has fallen down, the processing device is to compare parameters including speed, acceleration and other parameters with a stored predetermined value so as to determine the failure of the hedge trimmer 10'. If the comparison has a result out of an allowable range, a fault or failure reminder of the hedge trimmer 10' is presented on the display part of the mobile terminal 301' and/or the wear device 302' to remind to the user to repair the hedge trimmer 10' with the motor locked. Certainly, the grass cutter 10 can also employ the above fault detection subsystem.

Figure 6:
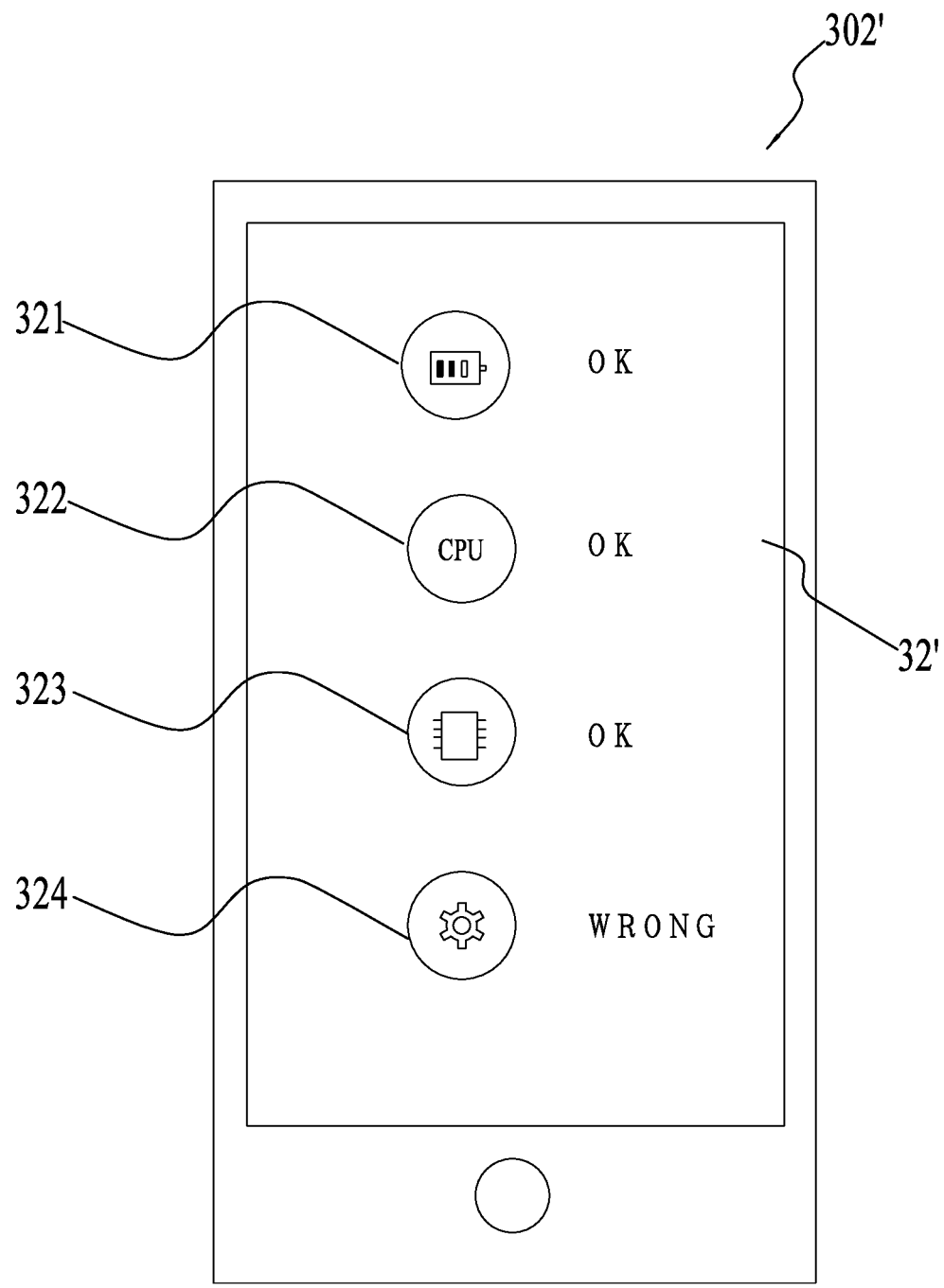
FIG. 6 illustrates an exemplary display interface of a data display device included in the power tool system of FIG. 5.

As shown in FIG. 6, the mobile terminal 301' acting as a type of data retrieval and/or process equipment or means, is set for receipt of the fault or failure information via a network communication. In an alternative embodiment, the mobile terminal 301' is set to store the power tool and/or the fault detection subsystem program routines, which are presented on the display interface or screen in a graphical form for the user. Specifically, the user operates to call for the stored program routine for controlling the fault detection subsystem in the mobile terminal 301' before starting the power tool system, such that the fault detection subsystem is enabled to detect the power tool or battery pack. For example, the fault detection subsystem is to detect whether the fault in the battery pack happens, and a reminder of whether the fault of the battery pack happens is displayed on the battery display unit 321 of the battery or battery pack. If no fault of the battery pack has happened, the battery display unit 321 displays "OK", and if a definite fault of the battery has happened, the battery display unit 321 displays "WRONG". Similarly, the fault detection subsystem is to detect whether the fault in the control system happens, and a reminder with the word "OK" or "WRONG" is displayed on the control display unit 322 so as to inform the user whether the control system has had a fault. Further, the fault detection subsystem is to detect whether the connection circuit between the battery pack 20' and the hedge trimmer has a fault and the circuit display unit displays with the word "OK" or "WRONG" for the user to know whether the circuit has the fault. The fault detection subsystem is to detect the fault condition of hedge trimmer 30', a tool display unit 324 display with the word "OK" or "WRONG" for reminder of whether the hedge trimmer 30' has had a fault. When the number of display units including the battery display unit 321, the control display unit 322, the circuit display unit, the tool display unit 324 displays with the same word "OK", it is obvious that the whole power tool has no fault and then the user can start the power tool by inputting a start command on the input device.

It should be noted that the fault detection subsystem can be set in the power device, for example by employing the battery pack or means with a source-based transceiver which can transmit the fault information to the data retrieval and/or process equipment.

Figure 7:
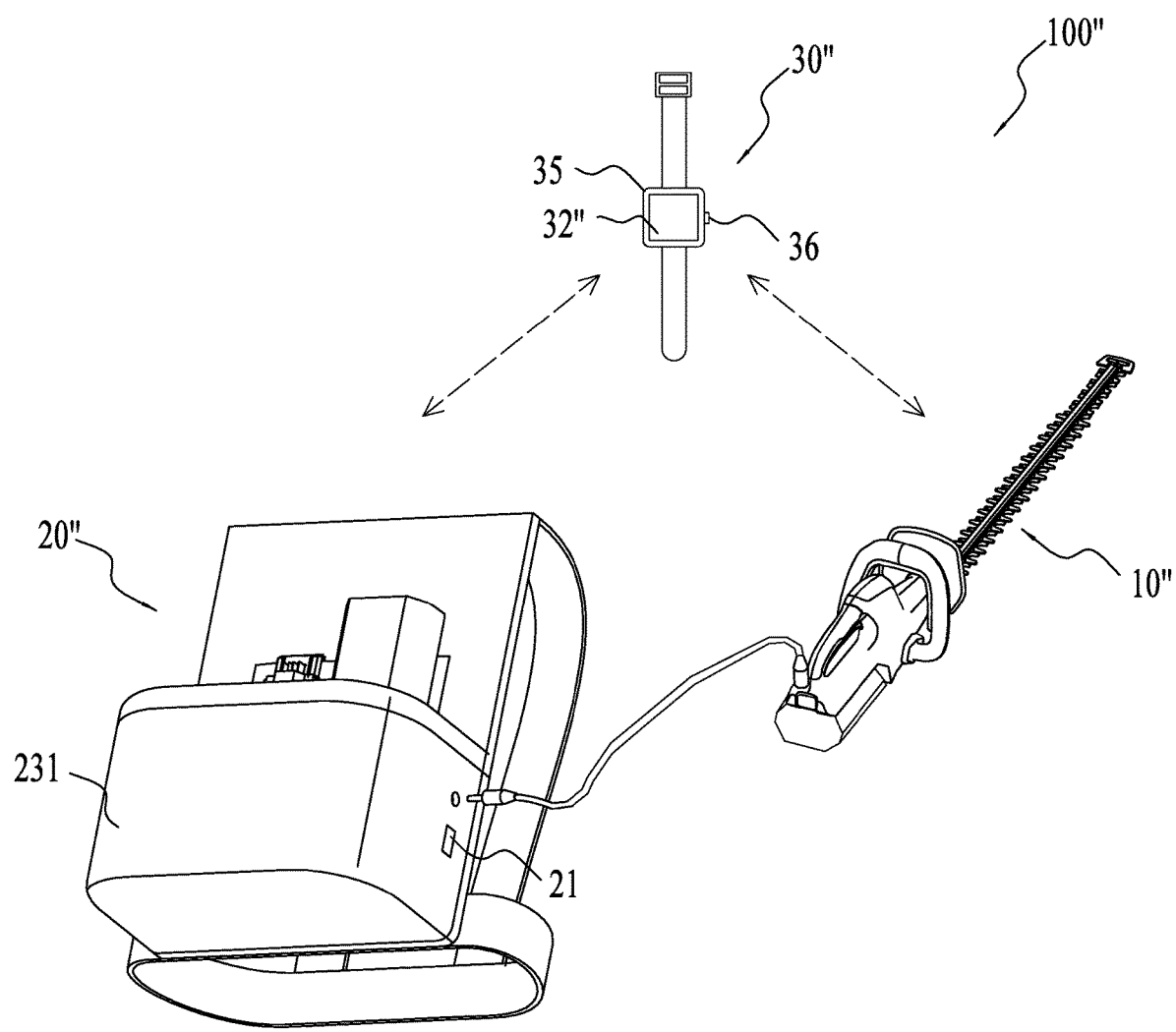
FIG. 7 illustrates another exemplary power tool system.

In FIG. 7, the system 100 "includes the hedge trimmer 10", a backpack battery pack 20" and a wristband 30".

The hedge trimmer 10" includes a motor, a drive system, a work head, a fault detection subsystem, a control system, a source-based transceiver, a store device, a processing device, and a wristband 30" acting as a data retrieval and/or process equipment with a source-based transceiver and a data display part. With the above configuration, the fault detection system of the hedge trimmer 10' can also do the similar function as described above.

The difference of the system 100 "of FIG. 7 with the above embodiments is that the wristband 30", functioning as a data retrieval and/or process equipment, still includes a device case 35, an internal battery cell disposed within the device case 35 and a rechargeable port 36. The internal battery cell is for powering the data retrieval and/or process equipment, the rechargeable port 36 is set on the device case 35 for charging the internal battery cell with the port 36. The rechargeable port 36 may be a USB interface. The backpack battery pack 20" has a power port 21 adapted to be mated with the rechargeable port 36. Thus, the wristband 30" can be powered by the backpack battery pack 20" by the power port 21 and the rechargeable port 36.

In an alternative embodiment, the backpack battery pack 20" has a fault detection subsystem, a store device, a processing device and a source-based transceiver. For example, the fault detection subsystem of the backpack battery pack 20" includes a voltage detection module, a current detection module, a temperature detection module, a power detection module, and the like. The store device stores the performance parameters including a predetermined current or voltage of the battery pack works at a normal state. The processing device is to compare the detected voltage with the predetermined voltage of the store device to have a result whether the detected voltage is higher or lower than the predetermined voltage to determine if a fault happens, and then to control the source-based transceiver to send a fault reminder of the battery pack to the wristband 30" of the user.

The hedge trimmer 10" may also include a source-based transceiver which is set to transmit data to the wristband 30" and to receive the data from the source-based transceiver of the battery pack 20". For example, the source-based transceiver of the hedge trimmer 10" is to be set for receipt of the pack fault information from the source-based transceiver of the battery pack, the control system of the hedge trimmer 10" sends a stop command to stop the hedge trimmer 10" upon the receipt of the fault information of the battery pack, while the display part 32" of the wristband displays the fault information of the battery pack for the user. Then, the user can stop the use of the battery pack by the input device of the wristband, which can transmit a select command of the user to the battery pack via the source-based transceiver within the wristband.

In another aspect of the disclosure, the power tool system includes a power tool including an electrical device, a power device for powering the electrical device, a position detection system for detecting a position of the power tool and/or the power device, a source-based transceiver for at least transmitting data corresponding to the position detected by the position detection system, and a data retrieval and/or process equipment adapted to selectively receive data from the source-based transceiver at a position around the power tool and/or a position remotely removed away from the power tool. That is the power tool system 100 of FIG. 1 includes a position detection system for detecting a position of the power tool and/or the power device.

Figure 8:
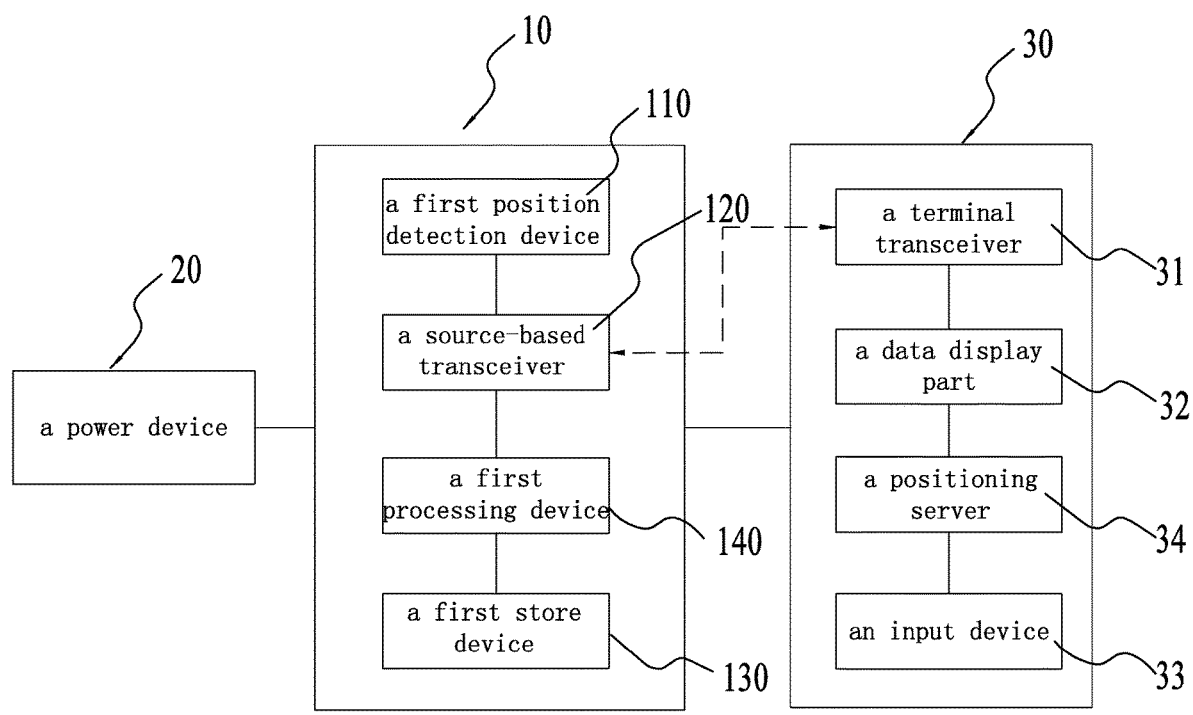
FIG. 8 is a block diagram of the power tool system of FIG. 1 with dashed arrows showing wireless communications between parts.

In FIG. 8, the grass cutter 10' includes a first position detection device 11', a source-based transceiver 12', a first store device 13' and a first processing device 14', and a first control device 15'.

The first position detection device 11' is for detecting a position and/or a position change of the grass cutter 10'. Of course, the first position detection device 11' may be set on the power device to detect a position and/or a position change of the power device.

The first source-based transceiver 12' is for transmitting data corresponding to the position detected by the first position detection device.

The first store device 13' is for storing the position parameters including border data and/or regional maps of the grass cutter 10' and/or how the battery pack behaves on the daily activities, except for including the normal performance parameters of the grass cutter 10' or how the battery pack works at a normal state. The performance parameters of the grass cutter may include, for example positions, position variables and/or position accelerations associated with the grass cutter or the cutter blades, while the performance parameters of the battery pack may include positions of the battery pack, voltages of the battery pack and power of the battery pack.

Further, the first store device 13' includes a register module set to temporarily store the current position of the grass cutter, and to update the position of the grass cutter in case the first position detection device has read out the position information.

The first processing device 14' is set to determine whether the grass cutter or the battery pack works at a safety state based on the detected positions by the first position detection device 11. The working safety states may include states of whether the grass cutter or the battery pack works well, or whether the grass cutter or the battery pack works beyond the limit activity regions. If the first processing device 14' determines the grass cutter or the battery pack works at an unsafe state, an alarm reminder is controlled to send to the data retrieval and/or process equipment via the first source-based transceiver 12'. It is possible that the first processing device 14' calls for the allowable regions or regional maps of the grass cutter 10' stored in the first store device 13', and is to compare with the detected position data of the first position detection device so as to have within the regional map a relative position or position movement path, which is enabled to be sent to a display screen or part of the data retrieval and/or process equipment for display.

The first control device 15' is to store the program routine for controlling the work of the grass cutter with a first control unit for controlling the motor and a second control unit for controlling the movement path of the grass cutter.

Herein, the data retrieval and/or process equipment 30' of FIG. 8 is similar to that of FIG. 2 described above, and the portable computer may function as the data retrieval and/or process equipment 30'.

With the above configuration, the user can remotely monitor the positions, and/or the position variables of the grass cutter 10', and then control the movement of the grass cutter 10' at a remote location.

Figure 10:
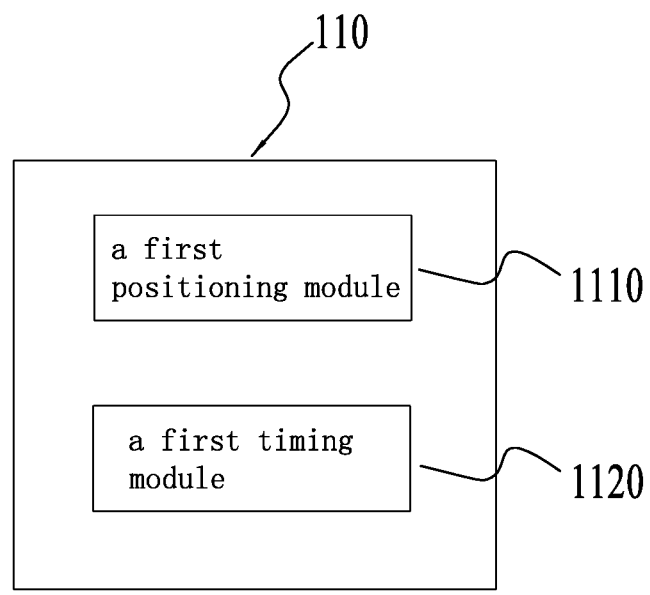
FIG. 10 is a block diagram of a position detection system of the power tool system of FIG. 1.

In an embodiment of FIG. 10, the first position detection device 11' includes a first positioning module 111 for capturing of the grass cutter 10' position information including latitude and longitude location points (or GPS location), which are to be sent via the first source-based transceiver 12' to the data retrieval and/or process equipment 30' for the user to grasp the position or movement path of the grass cutter in real time. In addition, the first processing device 14' is set to compare the detected latitude and longitude location points by the first positioning module 111 with the stored allowable latitude and longitude data in the first store device to determine whether the grass cutter works well. For example, the detected latitude and/or longitude location points by the first positioning module 111 is beyond the predetermined latitude and/or longitude location points, it is determined to have a result that the grass cutter is operating beyond an allowable activity region. The first source-based transceiver sends the determination result to the data retrieval and/or process equipment 30' for reminding the user. In an alternative embodiment, the first positioning module 111 includes a GPS unit and an antenna unit. When the GPS unit cannot get the position information of the power tool, the data retrieval and/or process equipment 30' outputs a corresponding reminder which may be in voice, in text, or outputs a voice reminder along with a text reminder.

The first position detection device 11' includes a timing module for recording an operating time that the power tool and/or the power device has. Specifically, the first position detection device 11' includes a first timing module 112 having a function of time for the first position detection device 11' to record the time information of the detected position by the first position detection device 11' so as to enable the time information via the first source-based transceiver to be displayed on the display part.

The first position detection device 11' still includes a function of position detection by use of a sensor or sensors, for example which may be a selected one or a combination thereof: a position sensor, a position sensor, angle sensor, vibration sensor and gyroscope. The first position detection device 11' can be used to detect positions, speeds, speed variables, acceleration variables of the grass cutter, and positions and directions of the grass cutter with respect to the data retrieval and/or process equipment so as to provide the usage state of the grass cutter for the user. If the ground where the grass cutter does work is uneven, the angle sensor is set to sense position variables of the grass cutter along a vertical direction, the first processing device 14' is to compare the detected angle by the angle sensor with the predetermined angle stored in the store device, so that the user is reminded of an operation such as closing the grass cutter when a comparison result of the first processing device 14' exceeds a normal value.

As the cutter blade or blades act as the working unit of the grass cutter 10, the position detection of the cutter blade can be also used to determine whether the grass cutter 10 has failed or whether it has been used abnormally, such as blade detachment or no blade installed.

Figure 9:
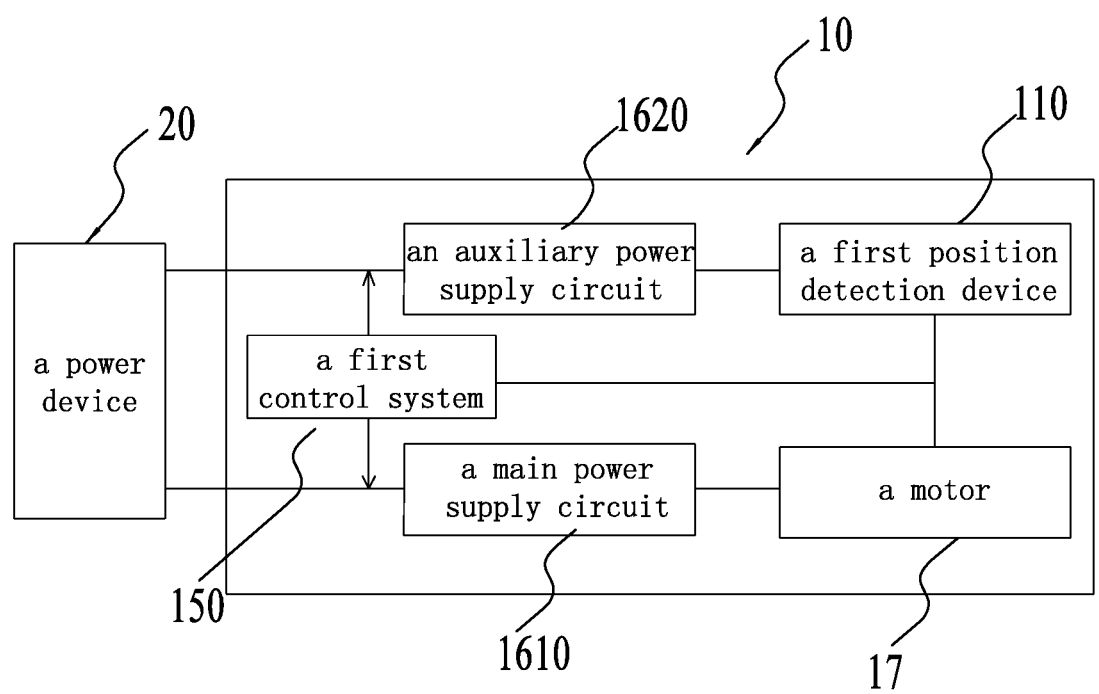
FIG. 9 is a block diagram of a power device and a power tool of the power tool system of FIG. 1 with solid lines showing the control relationship of a control system for the power device and the power tool.

In an embodiment of FIG. 9, the grass cutter 10' comprises a main power supply circuit 161', an auxiliary power supply circuit 162' and a first control system 15, wherein the main power supply circuit 161' is connectable between the power device and the motor for powering the motor. The auxiliary power supply circuit 152' is connected between the power device 20' and the first detection device 11' for power the first detection device 11'. When the main power supply circuit 151' is disenabled, the auxiliary power supply circuit 152' powers the power tool, the battery or battery pack. Specifically, the auxiliary power supply circuit 152' supplies the power of the first position detection device 11' so that the first position detection device 11' can perform the position function, for example in case the grass cutter is stolen, the first position detection device 11' is still powered by the auxiliary power supply circuit 152' to track the grass cutter so as to find the stolen grass cutter. That is, the power tool system includes a main power supply circuit for powering any part of the power tool system including the position or target detection subsystem, the auxiliary power supply circuit is utilized to power the position or target detection subsystem when the main power supply circuit is disenabled. It should be noted that the auxiliary power supply circuit may be within the power tool, the battery pack or any part of the power tool system, or the auxiliary power supply circuit may be an independent device or means external to the power tool and/or the battery pack.

Figure 11:
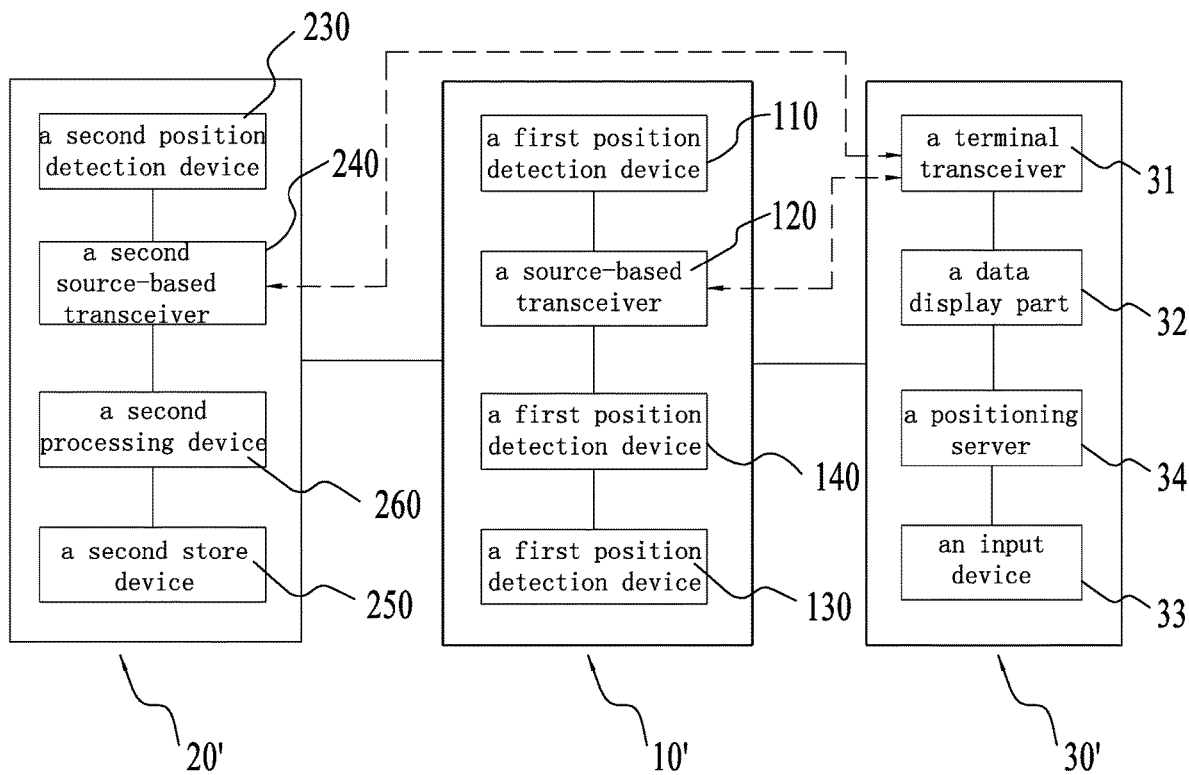
FIG. 11 is a block diagram of the power tool system of FIG. 5 with dashed arrows showing wireless communications between parts.

FIG. 11 depicts a position detection system for of FIG. 5 the power tool system including a hedge trimmer 10', a battery pack 20' and a data retrieval and/or process equipment 30' with a mobile terminal 301' and a wear device 302'.

The hedge trimmer 10' includes a motor, a drive system, a work head, a first position detection device 11', a first source-based transceiver 12', a first store device 13', a first processing device 14', a mobile terminal 301' and a wear device 302' each having a source-based transceiver and a data display part. With the above configuration, the position detection system of the hedge trimmer 10' can also do the position detection function as described above.

The difference with the above embodiment is that the battery pack 20' of FIG. 11 includes a second position detection device 23', a second source-based transceiver 24' and a second store device 25'.

The second position detection device 23' is to detect at least one of a position, a movement path, speeds or speed variables of the battery pack 20'. Specifically, the second position detection device 23' includes a second positioning module 231' and a second timing module 232'. The second positioning module 231' is to detect the position of the battery pack including latitude and/or longitude location data of the battery pack, while the second timing module 232' is to record time data associated with the operation time that the battery pack and/or the power tool has, such as data of time corresponding to position changes.

The second store device 25' connects with the second positioning device 23' and the second source-based transceiver 24'. The second store device 25' is set to store position parameters or data including border data and/or regional maps of the battery pack and/or how the grass cutter 10' behaves on the daily activities, and to store of the battery pack positions and work time detected by the second position detection device, such as data of latitude and/or longitude location and time corresponding to position changes.

Figure 12:
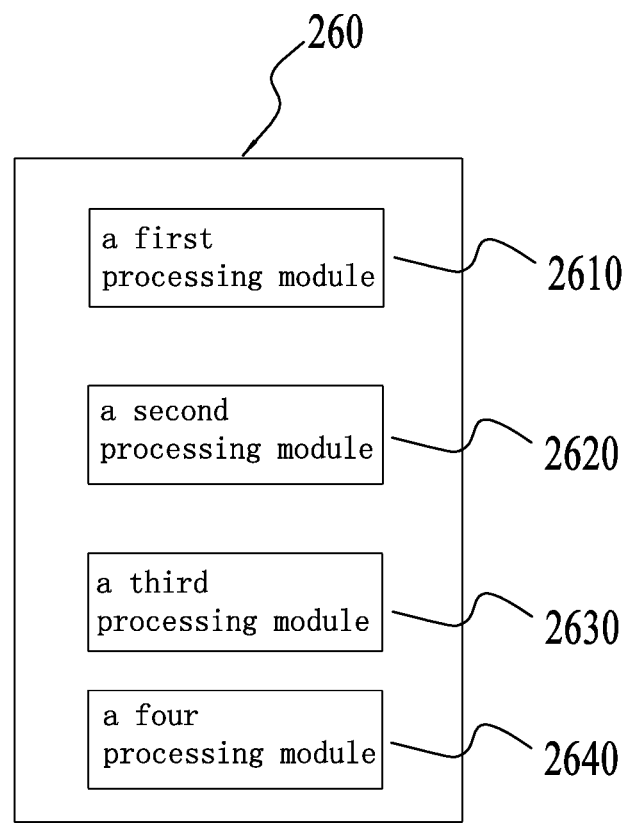
FIG. 12 is a block diagram of a processor of the power tool system of FIG. 5.

As shown in FIG. 12, the battery pack 20' includes a second processing device 26' connected with the second position detection device 23' and the second store device 25'. The second processing device 26' has a function of converting and calculating the data into which the data is input. In an alternative embodiment, the second processing device 26' includes a first processing module 261', a second processing module 262', a third processing module 263' and a four processing module 264'. The first processing module 261' is set to compare the battery pack positions by the second detection device with border data of the battery pack and/or how the grass cutter behaves on the daily activities to determine whether the battery pack or the grass cutter acts within an allowable region. The second processing module 262' is set to compare the positions of the battery pack detected by the second detection device with the detected position of the hedge trimmer 10' by the first detection device to obtain the location between the battery pack and the hedge trimmer 10'. The third processing module 263' is set to compute the movement speed of the battery pack by obtaining the positions of the battery pack detected by the second positioning module and the time of the battery pack detected by the second timing module. The four processing module 264' is set to compare with the respective positions on different time to obtain the movement path and direction of the battery pack. In an alternative embodiment, the second processing device 26' may compare the positions of the battery pack detected by the second positioning device 23' and the stored regional map of the second store device 25' so as to obtain the relative movement of the battery pack to the regional map for the user to track the target of the battery pack or the power tool. If the battery pack 20' walks beyond the allowable activity region, a reminder is transmitted to the display part of the mobile terminal 301' and a wear device 302' to remind the user that the battery pack has been stolen and suggest the user to lock the power tool.

The second source-based transceiver 24' is configured to connect the second position detection device 23', the second processing device 26' and the second store device 25' so as to transmit thereto the position detected by the second detection device. The second processing device is to compare the detected position of the battery pack with the stored position of the store device to have a comparison result to be transmitted to the data display part for the user to track the target of the battery pack or the power tool.

In addition, the second position detection device 23' includes a voltage detection module for detecting the voltage of the battery pack. In detail, the voltage detection module is to detect the voltage of the battery pack, the second processing device 26' is to determine whether the detected voltage is too high by comparison, the second source-based transceiver 24' is to transmit the fault information of the battery pack to the data retrieval and/or process equipment so as to remind the user. The voltage detection module may be a voltage sensor.

The second position detection device 23' includes a temperature detection module and/or a current detection module for detecting the temperature and/or the current of the battery pack. When the detection module or modules determine the detected temperature and/or current of the battery pack is too high or too low, the second source-based transceiver is controlled to transmit the data information of when the battery pack has the failure happened to the mobile phone for reminding the user. Of course, combination of a number of data including the current, the temperature of the battery pack can be utilized to determine the failure of the battery pack.

When the data display part displays the battery pack is beyond a normal activity area at the condition that the battery pack 20' for the hedge trimmer 10' is gradually consumed, the voltage detection module is enabled to detect the voltage of the battery pack, the second processing device 26' reads the control predetermined voltage of the store device 25', and sends a reminder to the mobile terminal 301' and a wear device 302' for the user and to stop supplying power to the motor by the battery pack to conserve the power of the battery pack to permit the position detection device to be still working properly for tracking the target of the grass cutter, in the case that the detected voltage of the battery pack is less than the control predetermined voltage of the store device. Specifically, the first control device can send a control command to stop supplying power to the motor.

Figure 13:
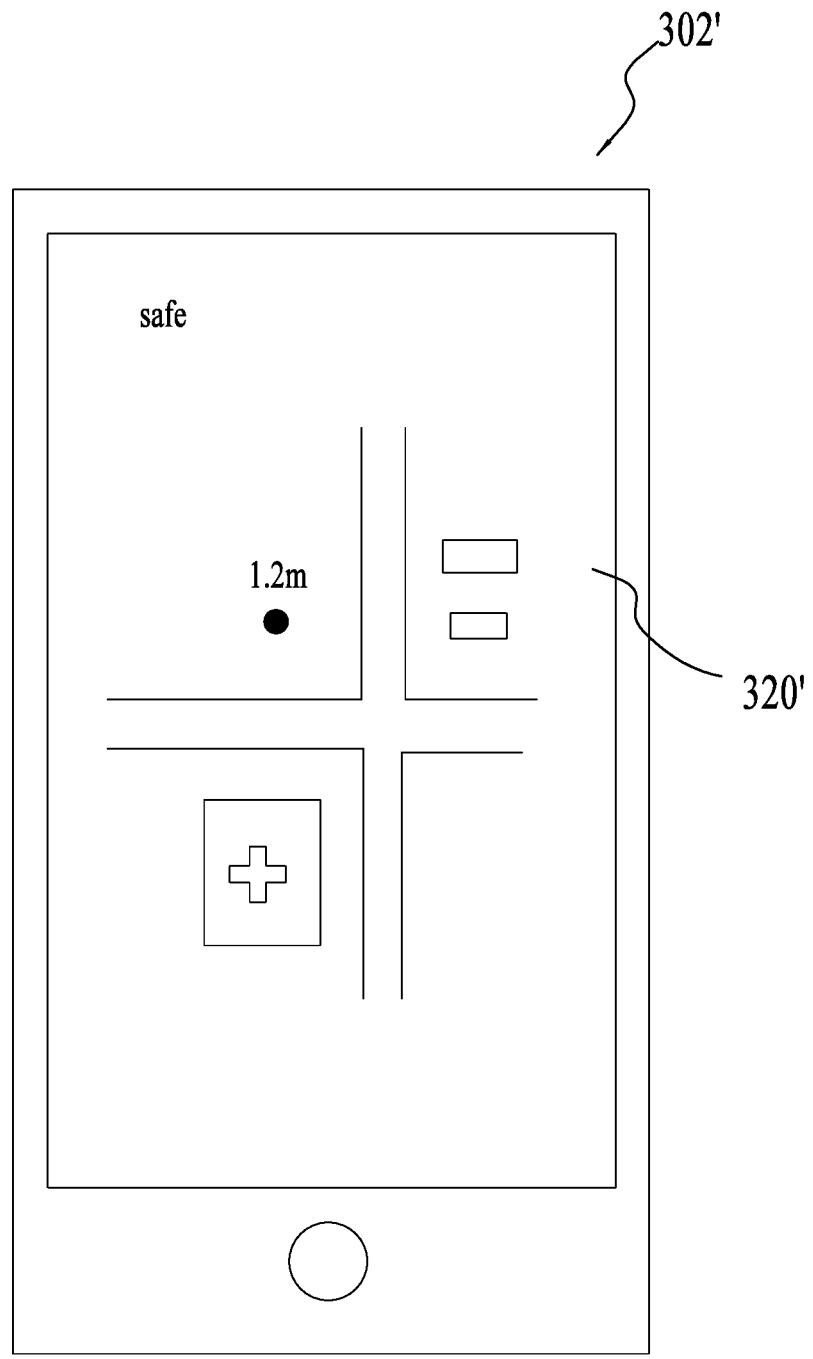
FIG. 13 illustrates an exemplary display interface of a data display device included in the power tool system of FIG. 5.

In FIG. 13, the mobile terminal 302' acting as a type of data retrieval and/or process equipment can do the transmission of data information via a network communication. In an alternative embodiment, the mobile terminal 302' is set to store the position detection device program routines, which are presented on the display interface in a graphical form for the user. The mobile terminal 302' still includes a positioning server or servers which may be from companies with any server or servers having a positioning function, such as Baidu positioning server, high-German positioning server, Google positioning server and etc. Specifically, the user calls for the stored program routine for controlling the first position detection device before the first positioning detection device is enabled to detect the power tool. The self-installed positioning server of the mobile terminal real time displays information of such as Baidu map, the positions and location movements detected by the first position detection device can be processed to be synchronized with real-time display within the Baidu map of the display part, so that the user can track the specific location of the power tool and the distance between the power tool and the mobile terminal by the map of the display part for display. For example, the display part of the mobile terminal displays between the power tool and the mobile terminal the distance being 1.2 kilometer, which is within an allowable activity area. Of course, the battery pack 20' can also employ a display interface having such as a Baidu map as similar to the above of the embodiments of the power tool.

A position detection system can be also used for the power tool system of FIG. 7. The backpack battery pack 20" includes a second position detection device, a second processing device, a second store device and a second source-based transceiver. For example, the second position detection device of the backpack battery pack 20" detects the position of the backpack battery pack 20", and the second source-based transceiver transmits the position information of the battery pack 20" to the wear device to remind the user.

The hedge trimmer 10" includes a first position detection device, a first processing device and a first source-based transceiver for receipt of the data information from the first source-based transceiver of the battery pack 20" and for transmission of the data information to the wear device 30'. For example, the hedge trimmer 10" has the first source-based transceiver for receipt of the battery position information transmitted from the second source-based transceiver of the battery pack 20". The hedge trimmer 10" may include a display unit displaying the position information of the battery pack and/or the hedge trimmer.

Figure 14:
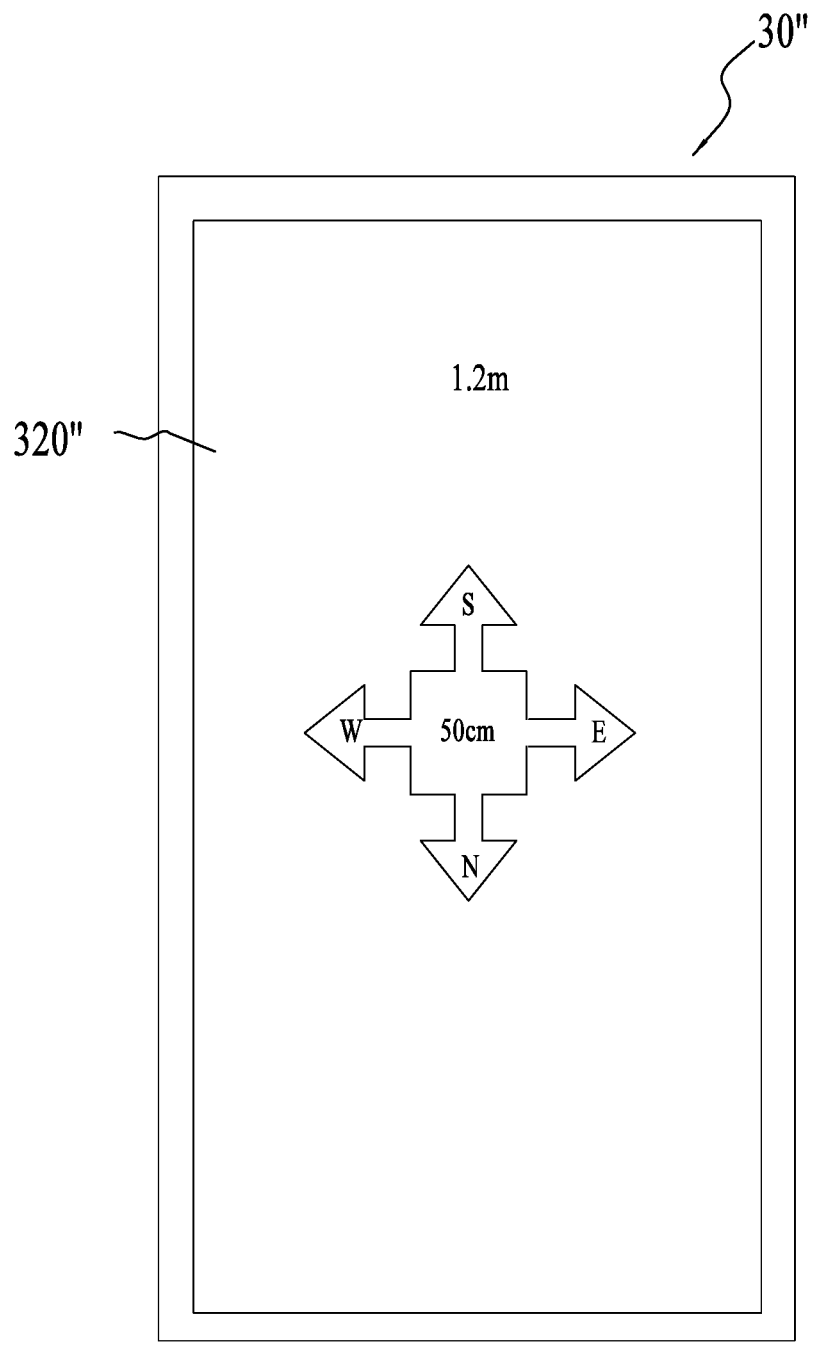
FIG. 14 illustrates an exemplary display interface of a data display device included in the power tool system of FIG. 7.

FIG. 14 depicts a display interface of the wear device 30". The wear device includes a positioning server or servers adapted to catch the position of the wear device. The terminal transceiver of the wear device is to receive the position information of the hedge trimmer transmitted by the first source-based transceiver of the hedge trimmer, so that the position information of the hedge trimmer is enabled to be displayed on a display interface of the wear device. The display interface may both display distances between the hedge trimmer and the wear device, and directions of the hedge trimmer with respect to the wear device. Specifically, the display interface indicates the direction of the hedge trimmer and the distance between the hedge trimmer and the wear device so as to guide the user wearing the wristband to track the hedge trimmer. For example, when the arrow "N" is lighted on the display interface with a number "50" indicating the hedge trimmer is 50 m to the south of the user, the lighted arrow thus instructs the user to go to the south to follow 50 m to track the target of the hedge trimmer. This way of using an arrow with a number thereon can instruct the user to track the hedge trimmer.

Figure 15:
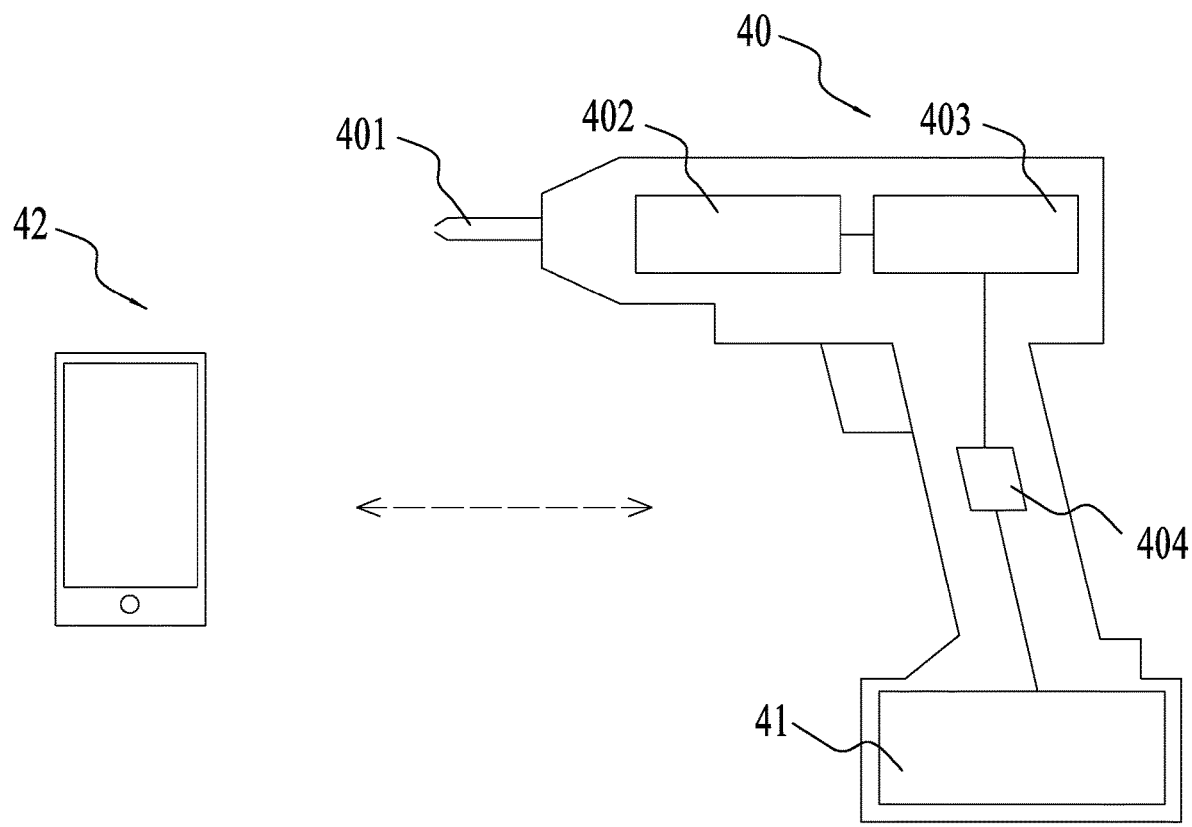
FIG. 15 illustrates another exemplary power tool system.

FIG. 15 depicts a power tool system including a drill 40', a mobile terminal 42', and a battery pack 41' detachably mounted onto the drill to power the drill.

The drill 40' includes a drill bit 401', a motor 404', a first position detection device 402', a first source-based transceiver 403', a first processing device (not labeled), and a first store device. The mobile terminal includes a terminal transceiver and a display unit. This configuration can also achieve the position detection function as described above.

The difference with the above embodiments is that the first position detection device 402' includes a laser range finder disposed adjacent to the drill bit to detect the distance from the drill to the wall to be drilled so as to judge whether the drill bit has been drilled into the wall. The first source-based transceiver 403' is enabled to transmit the detected distance from the drill to the wall to be drilled to the mobile terminal.

Figure 16:
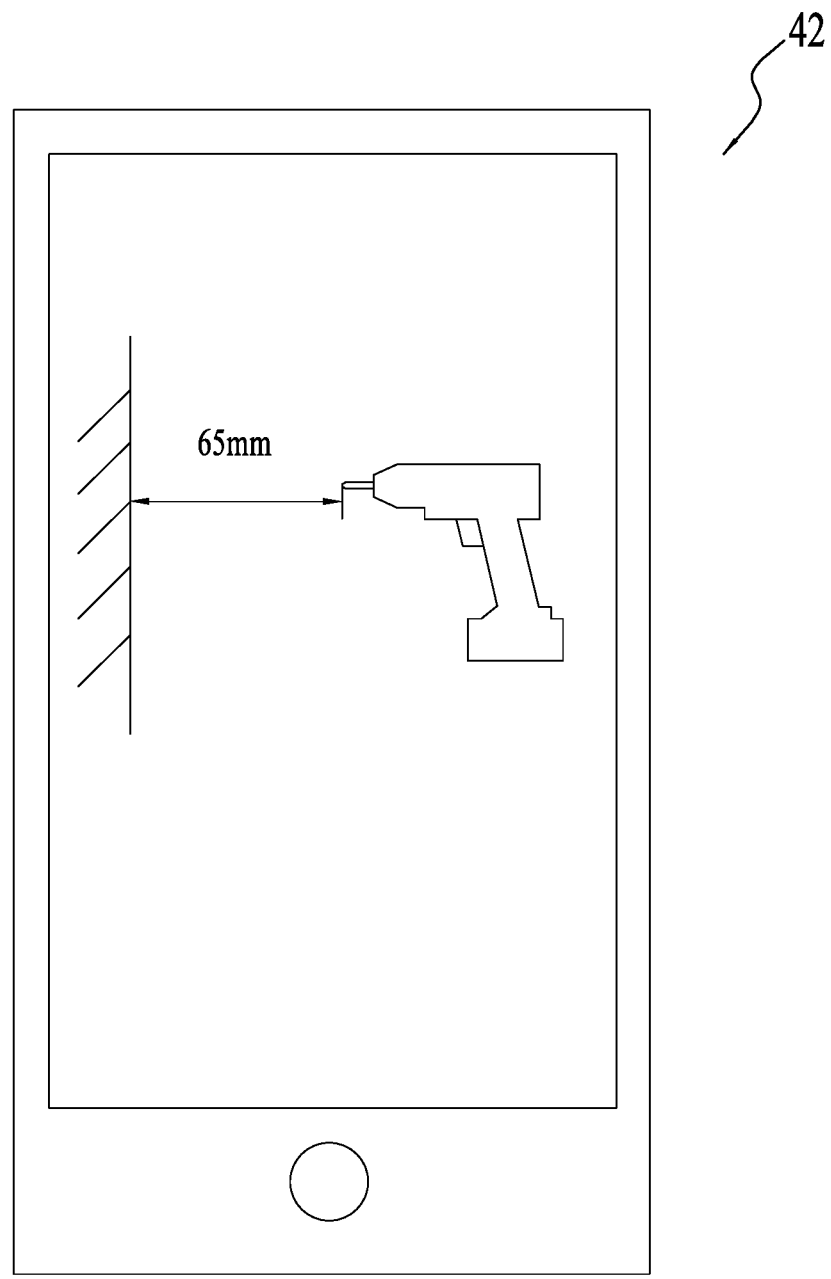
FIG. 16 illustrates an exemplary display interface of a data display device included in the power tool system of FIG. 14.

FIG. 16 shows a measurement display interface of the mobile terminal. When the distance is detected to be 65 mm from the drill bit to the wall, the measurement display interface displays "65 mm". It should be explained that the positions of the drill bit and the wall to be drilled varies depending on the object to be detected or the relative position of the drill bit and the wall to be drilled maintains unchanged. Different drill bits may be selected to be subjected to different conditions in construction. The drill also has a clear function. Specifically, the drill has a reset button connected with the laser range finder, the user presses the reset button to make the measurement result cleared to be subjected to a new replacement of the drill bit to be later measured.

The above illustrates and describes basic principles, main features and advantages of the present invention. Those skilled in the art should appreciate that the above embodiments do not limit the present invention in any form. Technical solutions obtained by equivalent substitution or equivalent variations all fall within the scope of the invention hereinafter claimed.

What is claimed is:

1. A power tool system, comprising:
a power tool including an electrical device;
a power device for powering the electrical device;
a fault detection subsystem for detecting failure of at least one of the electrical device, the power device, or a connection circuit connected between the electrical device and the power device;
a source-based transceiver for at least transmitting data corresponding to the failure detected by the fault detection subsystem; and
a data retrieval or process equipment comprising a terminal transceiver adapted to receive data from the source-based transceiver, the data retrieval or process equipment independent of the power tool and configured to be remotely removed away from the power tool, wherein the power device comprises a main power supply circuit for powering the electrical device, and an auxiliary power supply circuit for powering the fault detection subsystem, wherein the main power supply circuit and the auxiliary power supply circuit both connect to the power device and the fault detection subsystem still works by power of the auxiliary power supply circuit when the main power supply circuit is disabled, and wherein the data retrieval or process equipment is further configured to:

transmit a signal to the main power supply circuit indicating that the voltage of the power device is less than a first control voltage while maintaining the auxiliary power supply circuit for powering the fault detection system, when the received data indicates that the voltage of the power device is less than the first control voltage; and transmit a stop signal to stop the auxiliary power supply circuit for powering the fault detection system, when the received data indicates that the voltage of the power device is less than a second control voltage, thereby providing hierarchical control of the power device.

2. The system of claim 1, wherein the data retrieval or process equipment includes a terminal transceiver configured to form a wireless communication network with the source-based transceiver.

3. The system of claim 1, wherein the data retrieval or process equipment includes a data display part configured for displaying the data received by the terminal transceiver.

4. The system of claim 1, wherein the power tool system includes:
a store device for storing predetermined data corresponding to performance parameters of the power tool, the power device, or the connection circuit working at a normal state;
a processing device for comparing the detected data as detected by the detection subsystem with the predetermined data to determine whether the power tool, the power device, or the connection circuit has had a failure;
wherein the source-based transceiver is controlled to transmit a reminder about the failure information when any failure of the power tool, the power device, or the connection circuit is determined by the processing device.

5. The system of claim 1, wherein the power device comprises a battery pack including a battery and a battery case for receiving the battery therein, and the fault detection subsystem comprises a voltage detection module for detecting a voltage of the battery, wherein the source-based transceiver transmits to the data retrieval or process equipment a reminder for informing the user of the failure the battery pack when the detected voltage of the battery pack by the voltage detection module is too high or too low.

6. The system of claim 1, wherein the power device includes a control system for controlling the electrical device, the fault detection subsystem connects with the control system such that the fault detection subsystem is enabled to detect whether the control system is working at a normal state.

7. The system of claim 1, wherein the electrical device includes a motor, the power tool comprises a working unit and a drive system connected between the motor and the work unit for driving the working unit, and the fault detection subsystem includes a position sensor, a vibration sensor or a noise sensor for detecting an operating condition of the working unit or the drive system.

* * * * *